VAPOR DEPOSITION METHOD FOR FORMING THIN POLYMERIC FILMS

Filed June 24, 1964

ELECTRON BEAM DENSITY J = .1 − .6 MA/CM$^2$
SYSTEM PRESSURE 1×10$^2$ TORR
SUBSTRATE TEMPERATURE 25° C.

INVENTORS
EDWARD M. DA SILVA
RICHARD T. BOGARDUS

S. P. Tedesco

ATTORNEY

United States Patent Office 3,406,040

Patented Oct. 15, 1968

3,406,040
VAPOR DEPOSITION METHOD FOR FORMING THIN POLYMERIC FILMS

Edward M. Da Silva, White Plains, and Richard T. Bogardus, Ossining, N.Y., assignors to International Business Machines Corporation, New York, N.Y., a corporation of New York Filed June 24, 1964, Ser. No. 377,674
3 Claims. (Cl. 117—93.31)

ABSTRACT OF THE DISCLOSURE

A process is described for depositing a thin polymeric film onto a substrate surface. An evaporant stream of polymerizable material is directed onto the substrate surface in a low pressure chamber and exposed along at least a portion of its travel to a transverse electron beam. Activated species are created in the evaporant stream which initiate the polymerization process in the gaseous phase and cause the evaporant to deposit on the substrate surface as a thin polymeric film. The activation ratio of the evaporant stream, i.e., the ratio of activated, or ionized, molecules to unactivated molecules, is controlled such that entire evaporant stream enters into the formation of the polymeric film. Accordingly, the system contamination is minimized and system pressures are maintained substantially constant such that the described process is compatible with other deposition processes to be effected in the same chamber.

This invention relates to improved methods for vapor depositing both polymeric and metallic films and, more particularly, to improved methods for vapor depositing continuous thin film patterns of selected geometry for use in microminiature circuits.

In the microminiature development undertaken by industry to reduce complexity and, also, the objectionable high cost of present day electronic systems, a definite need exists for a reliable method for forming continuous thin film patterns of both polymeric and metallic materials. Such thin film patterns are employed in the fabrication of both active and passive microminiature circuit elements and, also, functional interconnections therebetween to form integrated circuit arrangements. These microminiature circuit elements, both active and passive, can be characterized as comprising superimposed patterns of thin conductive films electrically insulated one from the other by a thin insulating, or dielectric, film. For example, a recently publicized thin film active device is the "cryotron" which comprises superimposed thin film gate and control electrodes arranged in magnetic field-applying relationship and electrically insulated one from the other by a thin dielectric film. Also, an example of a passive circuit device is the thin film capacitor which comprises superimposed, registered thin conductive film patterns, isolated one from the other by a thin dielectric film. Further, functional interconnections between such circuit elements are generally effected by thin film strip lines formed over a thin dielectric film to prevent electrical shorts therebetween and the underlying substrate and/or previously-deposited circuit elements.

Numerous methods have been described in the prior art for forming continuous thin film patterns of both polymeric and metallic materials. In addition to conventional vapor deposition techniques, such thin film patterns have been formed by radiation techniques, i.e., electron beam, ionic beam, etc., and, also, by the photolysis of thin films of organic and organo-metallic materials formed on a substrate. For example, electron beam techniques for polymerizing thin films of organic material have been described by P. White and I. Haller in "Polymerization of Butadiene Gas on Surfaces Under Low Energy Electron Bombardment," Journal of Physical Chemistry, vol. 67, 1963, page 1784, and by R. W. Christy in "Formation of Thin Polymer Films by Electron Bombardment," Journal of Applied Physics, vol. 31, No. 9, September 1960; a system for effecting an electron beam polymerization process has been described in the R. W. Christy Patent 3,119,707 which issued January 28, 1964. Also, a system suitable for fabricating continuous thin films by photolytically reacting organic and organometallic materials has been described in the copending patent application Serial No. 205,821, "Circuit Fabrication," filed June 19, 1962, now U.S. Patent 3,271,180, on behalf of P. White.

Systems for forming continuous thin film patterns should provide high deposition rates so as to reduce fabrication time and, therefore, the unit cost of individual circuit elements. Such systems should be reliable and have easily-reproduced parameters whereby continuous thin films of desired thickness can be obtained. Further, it is requisite that system contamination be minimal during the fabrication process to assure reproducibility of the thin film circuit elements. Since conductive films are extremely thin, e.g., in the order of 5000 A. to 10,000 A., slight contamination of such films may significantly affect the operating characteristics of active circuit devices. For example, slight contamination can significantly alter the critical temperature at which the gate conductor of a cryotron device first exhibits superconductivity. Also, contaminants in a thin polymeric film can form structural defects which increase the probability of faults or pin-holes which destroy the insulative properties of such films. It should be appreciated that a single defect in an operative integrated circuit arrangement can cause rejection of the complete package.

Accordingly, an object of this invention is to satisfy the present need in industry for a reliable deposition method for forming continuous thin films.

An object of this invention is to provide an improved method for forming continuous thin films, both polymeric and metallic, in precise geometric patterns onto a rigid substrate.

Another object of this invention is to provide an improved method for forming continuous thin metallic and/or polymeric films at a high deposition rate.

Another object of this invention is to provide a vapor deposition process wherein system contamination during and after a deposition process is minimized.

Another object of this invention is to provide an improved vapor deposition method wherein deposition parameters are easily established.

These and other objects and advantages are achieved in accordance with this invention by exposing a confined evaporant stream to an energy medium, such stream being thus activated and directed onto a substrate surface. Confinement of the evaporant stream when exposed to the energy medium allows for a controlled activation ratio, i.e., the ratio of activated, or ionized, molecules to unactivated molecules, and also prevents distribution of the vapor stream throughout the system. Since the activation ratio is controlled, all evaporant material directed onto the substrate surface enters into forming the thin depositant film. As hereinafter described, activated species of the evaporant material form nucleation sites on the substrate surface and, in effect, increase the sticking coefficient so as to reduce the rate of re-evaporation of unactivated species. Also, when the evaporant stream comprises polymerizable material, these activated species, in addition, serve to initiate the polymerization process and insure continuous, properly cross-linked polymeric films.

Polymerization techniques disclosed in the prior art require that energy carriers for initiating the reactive process be incident to the substrate surface. In such processes, generally effected in low pressure chambers, a predetermined partial pressure of polymerizable material to be reacted is introduced into the low pressure atmosphere and distributes itself as an adsorbed layer over all exposed surfaces of the system, i.e., the substrate surface. By directing the energy carriers incident to selected portions of the substrate surface, the adsorbed layer is reacted so as to form a continuous thin film pattern. Such processes necessarily increase system pressures so as to require subsequent pumping-down prior to a next-subsequent deposition process and, also, introduce contaminants, albeit adsorbed, within the system. Accordingly, after the formation of each thin film pattern, the fabrication process is interrupted to reduce system pressures so as to re-evaporate and exhaust the adsorbed molecules. Since binding forces are appreciable, adsorbed molecules are not easily re-evaporated and often remain on the substrate surface to contaminate subsequently-deposited thin film patterns.

In accordance with one aspect of this invention, continuous thin film patterns are formed with minimal system contamination by directing an activated stream of evaporant material onto the substrate surface. The evaporant material is activated by an energy medium which is not incident to the substrate surface. For example, in a preferred embodiment, an electron beam of controlled density is directed transverse to the path of the evaporant stream to the substrate surface. Moreover, as the evaporant stream is substantially confined, the activation ratio thereof can be precisely determined as a function of electron beam density. Since the activation ratio of the evaporant stream can be controlled, a sufficient number of nucleation sites on the substrate surface is assured whereby the entire evaporant stream enters into the formation of the thin film pattern. Accordingly, the possibility of system contamination is reduced; also, for similar reasons, system pressures are maintained substantially constant.

In accordance with another aspect of this invention, the structure of the electron beam source is determined so as to be virtually independent of the system in which it is operated. Moreover, such structure insures, firstly, that the entire evaporant stream is exposed to the electron beam so that the activation ratio can be precisely controlled and, secondly, that electric fields related to the trajectory of the electrons are essentially confined within the electron gun structure and desired activation of the evaporant stream is obtained with low accelerating potentials. Accordingly, positioning of the electron gun structure in relationship to other metallic parts of the system is not critical and the method of this invention is fully compatible with other deposition methods when effected in a same low pressure chamber.

The foregoing and other objects, features and advantages of the invention will be apparent from the following more particular description of preferred embodiments of the invention, as illustrated in the accompanying drawings.

Figure 1:
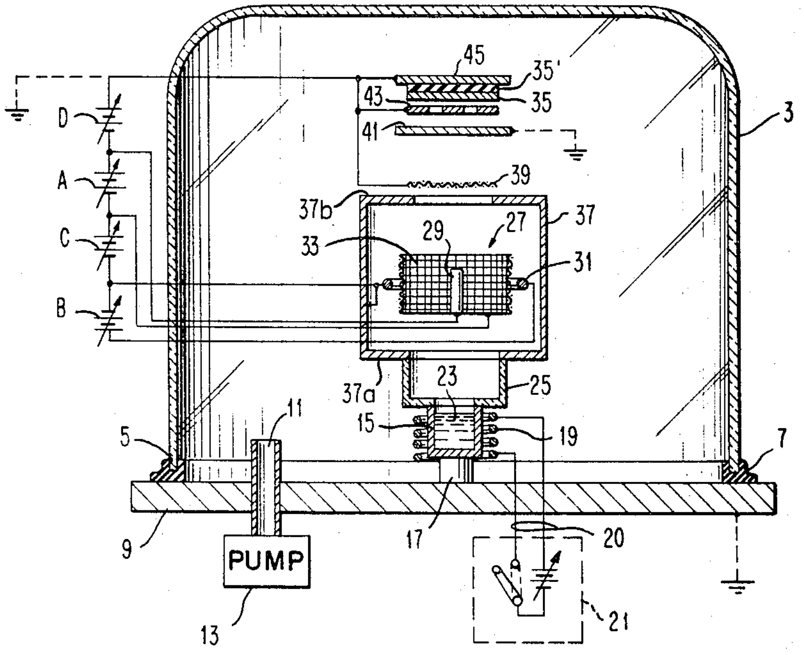
FIG. 1 shows a system in accordance with the principles of this invention suitable for vapor depositing continuous thin films, either polymeric or metallic, onto a substrate surface.

A system for effecting the method of this invention is illustrated in FIG. 1 as comprising a low pressure chamber 1 defined by a bell jar 3, the rim of which is received in annular groove 5 of rubber gasket 7. Rubber gasket 7 rests upon base plate 9 and provides an effective vacuum seal to pressures, for example, in the order of $10^{-6}$ torr. Low pressure chamber 1 is evacuated along exhaust port 11 by high efficiency vacuum pump 13. An evaporation source 15 is supported on ceramic standoff 17 which serves to isolate the said source from the base plate 9. Evaporation source 15 is of the resistance type and includes resistance heating element 19 connected along leads 20 which pass through base plate 9 to a controlled current source 21. Evaporation source 15 contains evaporant material 23 selected to be non-volatile at normal system pressures and temperatures. When resistance element 19 is energized by current source 21, the temperature of evaporant material 23 is elevated in excess of its vaporization temperature so as to volatilize and pass from source 15 as an evaporant stream.

A cylindrical baffle 25 of insulating material is positioned over evaporation source 15 which serves to direct the evaporant stream from evaporation source 15 into an electron gun structure generally indicated at 27. The electron gun structure 27, as shown, is symmetrical with the configuration of evaporation source 15 and cylindrical baffle 25. Electron gun structure 27 comprises an anode 29, which may be hollow, located with circular filament 31 and each disposed axially with respect to cylindrical baffle 25; in addition, a reticulate grid structure 33 is coaxially positioned between anode 29 and filament 31, spacing therebetween being determined to achieve high current densities during a deposition process with relatively low electron accelerating potentials applied between the filament and anode. As illustrated, anode 29 is connected to the positive terminal of anode supply A, filament 31 is connected across filament supply B, and grid structure 33 is connected at the positive terminal of grid supply C. Sources A, B, and C are shown as variable so as to provide an electron beam of controlled density between filament 31 and anode 29.

A cylindrical metallic shield 37 encloses electron gun structure 27. Shield 37 is multipled to filament 31 and serves as a heat radiation shield and, in addition, confines electrical fields so as to limit the patterns of electron accelerating fields between filament 31 and anode 29. Shield 37 is supported on cylindrical baffle 25 and includes lower and upper annular extensions 37A and 37B, respectively; circular openings defining extensions 37A and 37B, respectively, are coaxially aligned with cylindrical baffle 25. Accordingly, and as illustrated, the evaporant stream directed from source 15 passes upwardly along cylindrical baffle 25, through the opening in extension 37A and into the electron gun structure 27 so as to be exposed to the electron beam and then pass through extension 37B toward the substrate 35. A wire mesh 39 is positioned over the opening in extension 37B. As shown, wire mesh 39 and substrate holder 45 are multipled and connected to the positive terminal of variable accelerating supply D (system ground) to insure a field-free space over the surface of substrate 35 which is supported on the latter. As electrical fields for electron trajectory generated by the electron gun structure 27 are substantially totally confined within the cylindrical shield 37, the placement of such gun structure with respect to other metallic parts within the deposition system is not critical. Further, substantially all electrons from filament 31, as they are attracted to anode 29, travel through the evaporant stream as it passes upwardly toward the substrate 35.

A movable shutter 41 is positioned over substrate 35 to intercept the evaporant stream directed upwardly from electron gun structure 27. Shutter 41 is displaced to expose substrate 35 only during the deposition process and while desired system parameters are established, e.g., evaporation source 15 has been elevated to a desired temperature, beam current density in electron gun structure 27 has been determined, etc. Shutter 41 insures that evaporant material is deposited on substrate 35 at constant system parameters so as to obtain reproducibility. Also, pattern-defining mask 43 for defining a desired depositant pattern is positioned adjacent the surface of substrate 35. Wire mesh 39, pattern mask 43, and substrate holder 45 are multipled so as to be positively biased during the deposition process.

The method and structure of this invention is suitable for depositing both polymeric and metallic thin films. In each event, the vaporized stream of evaporant material, either polymerizable or metallic, is subjected to electron bombardment within electron gun structure 27. Accordingly, the activated evaporant stream passes through mask 43 and forms a continuous thin film pattern on substrate 35. Activated species of evaporant material tend to adhere more strongly to the surface of substrate 35 because of their negatively-charged state than do the unactivated species. As substrate holder 45 is biased positively, the charged state of the activated species supplements the normal binding forces therebetween and substrate 35 so as to reduce the probability of re-evaporation. Activated species adhering the surface of substrate 35 serve as nucleation sites and unactivated species striking such sites will be incorporated into the film whereby re-evaporation of evaporant material from the surface is reduced. It should be understood that the presence of activated species of the evaporant material supplements the number of nucleation sites normally present on the surface of substrate 35.

In accordance with one aspect of this invention, continuous thin polymeric films can be formed by subjecting a stream of vaporized polymerizable material to a transverse electron beam. The characteristics of polymerizable materials suitable in the described process are, firstly, that activated species are formed when subjected to electron beam bombardment which serve to initiate the polymerization reaction at the surface of substrate 35; secondly, that such material has a vaporization pressure below the normal system pressures maintained within the chamber 1; and, thirdly, that the thermal polymerization of such material at operating source temperatures should be preferably minimal. Numerous polymerizable materials exhibit these desired characteristics as, for example, bisphenol A-epichlorohydrin adduct, silicone oil, resorcinal diglycidyl ether, etc.

To deposit a thin polymeric film, selected material, e.g., biphenol A-epichlorohydrin, is positioned in source 15 and elevated above its vaporization temperature. The evaporant material volatilizes and passes upwardly along cylindrical baffle 25 and within circular grid 33. While passing through circular grid 33, some fraction of the evaporant molecules interact with the electron beam in a collision process to generate the active species, i.e., ionized molecules of the evaporant material. The activation ratio of the evaporant material, i.e., the ratio of activated to unactivated species, is a function of the collision cross-section which is dependent upon the density of the evaporant stream, i.e., the temperature of source 15, and, also, the density of the electron beam in electron gun structure 27. The activation ratio of the evaporant stream, therefore, is precisely controllable by determining the temperature of evaporant source 15 and, also, bias voltages supplied to grid 33 by source C. The activated evaporant stream passes through wire mesh 39 and into a field-free region therebetween and substrate 35. While evaporation source 15 is elevated to a selected temperature, the shutter 41 is positioned over substrate 35 and prevents deposition of evaporant material thereon.

When shutter 41 is displaced from over the substrate 35, selected portions of the activated evaporant stream are intercepted by pattern mask 43 so as to deposit in desired pattern on substrate 35. The presence of activated species of evaporant material accelerate the deposition process since they adhere more readily to the surface of substrate 35 than do the unactivated evaporant molecules. The activated, or ionized, molecules on the surface of substrate 35 create nucleation sites whereat the polymerization process takes place and, thus the probability of re-evaporation of evaporant material from the surface of substrate 35 is reduced. Continued deposition of the evaporant over substrate 35 forms a continuous reliable polymeric film.

Figure 2:
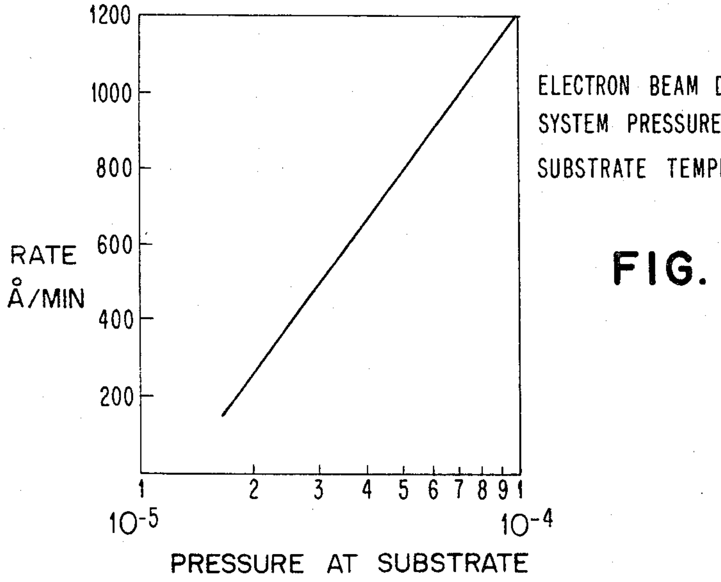
FIG. 2 illustrates a typical curve of the deposition rate plotted as a funcion of the log of the pressure of evaporant material in the region of the substrate surface.

By proper control of deposition parameters, i.e., potentials applied to grid 33 and the temperature of evaporation source 15, the activation ratio of the evaporant stream is determined such that all evaporant material directed onto substrate 35 enters into the formation of the continuous polymeric film; accordingly, pressures within chamber 1 are not materially affected during the deposition process and contamination is minimal. For example, when the positive biasing potential applied to grid 33 is increased, the probability of collisions between electrons and molecules of evaporant material within electron gun structure 27 and, therefore, the number of active species created are correspondingly increased. Also, similar effects are achieved by increasing the temperature of evaporation source 15 so as to increase the density of evaporant molecules within electron gun structure per unit time. FIG. 2 is a typical curve and gives deposition rate plotted as a function of the log of the pressure of bisphenol A-epichlorophydrin in the region of substrate 35 for a given range of current density in electron gun structure 27. Deposition rates obtained are greater than are obtained by prior art techniques wherein the electron beam is incident to the surface of substrate 35.

In accordance with another aspect of this invention, potentials developed across a multilayer structure during the deposition process are minimal. As illustrated, substrate 35, shown as a conductive thin film, is insulated from substrate holder 45 by a previously-deposited polymeric film 35'. Activated species incident on the surface of substrate 35 can have sufficient energy to cause secondary electron emission therefrom. Continued deposition of evaporant material, therefore, can result in the build up of a surface potential which is a function of the accelerating potential and the secondary electron emission coefficient of the particular surface. As shown, pattern mask 43 is maintained at a same or greater positive bias potential as substrate holder 45 to serve as a collector of secondary electrons during a deposition process. Accordingly, the depositing surface acquires a net positive charge due to the collection of secondary electrons by pattern mask 43 whereby electrical fields applied therebetween and substrate holder 45 and across previously-deposited thin polymeric film in the multilayer structure is minimal. It will be appreciated by those skilled in the art that surface potentials which build up on a metallic or insulating film depositing surface during a deposition process can be appreciable whereby the resulting electrical fields can be sufficient to rupture minor structural faults in previously-deposited polymeric, or insulating, films and destroy the usefulness of the multilayer structure. Also, since the magnitude of such electrical fields can be substantially in excess of specified tolerances, an otherwise satisfactory multilayer structure can be unnecessarily ruined. The collection of secondary electrons emitted from the depositing surface during the deposition process can appreciably increase the yield of the fabrication process.

It should be understood that the principles hereinabove described are equally applicable to the deposition of thin metallic films. For example, consider that a metallic evaporant is contained and vaporized within source 15 and is directed upwardly through electron gun structure 27. While passing through electron gun structure 27, the metal atoms are bombarded by the electron beam so as to create active species. As described, the activation ratio of the metallic evaporant stream is particularly determined so that all evaporant material enters into the formation of the conductive thin film. The active species, i.e., ionized atoms, in the evaporant stream tend to adhere more strongly to the surface of substrate 35 and provide additional nucleation sites for the evaporant material. Accordingly, re-evaporation of metal evaporant from the depositing surface of substrate 35 is reduced and system contamination is minimal.

While the invention has been particularly shown and described with reference to preferred embodiments thereof, it will be understood by those skilled in the art that various changes in form and details may be made therein without departing from the spirit and scope of the invention.

What is claimed is:

1. A process for producing continuous thin polymeric films on the surface of a rigid substrate comprising the steps of positioning a rigid substrate and a source of evaporant material in a vacuum chamber, evacuating said chamber, said evaporant material being polymerizable when subjected to electron beam irradiation and having a vapor pressure less than the pressure in said chamber, volatilizing said evaporant material so as to be substantially totally directed onto the surface of said rigid substrate, exposing said evaporant material along at least a portion of its travel onto the surface of said rigid substrate to electron beam irradiation directed substantially totally through and transverse to the path of said evaporant material to the surface of said substrate to create activated species of said evaporant material which are effective to initiate the polymerization reaction, and controlling the density of said electron beam irradiation to create sufficient activated species such that substantially all of said evaporant material goes to forming a thin polymeric film on the surface of said substrate and contamination in said chamber is minimal.

2. The process as defined in claim 1 including the further step of generating said electron beam within an electron gun structure, and further confining substantially all of said evaporant material to pass along said gun structure and be exposed to said electron beam.

3. The process as defined in claim 1 wherein said evaporant material is selected from the group consisting of bisphenol A-epichlorohydrin adduct, silicone oil, and resorcinol diglycycidyl ether.

References Cited

UNITED STATES PATENTS

| | | | |
|---|---|---|---|
| 2,428,868 | 10/1947 | Dimmick | 118—49 |
| 3,080,481 | 3/1963 | Robinson | 117—106 |
| 3,117,022 | 1/1964 | Branson et al. | 117—93.3 X |
| 3,132,046 | 5/1964 | Mann | 117—93.3 X |
| 3,161,542 | 12/1964 | Ames et al. | 118—49.1 X |
| 3,168,418 | 2/1965 | Payne, Jr. | 118—49.1 X |
| 3,192,892 | 7/1965 | Hanson et al. | 117—93.3 X |
| 3,183,563 | 5/1965 | Smith | 118—49.1 X |
| 3,211,570 | 10/1965 | Salisbury | 118—49 X |
| 3,297,465 | 1/1967 | Connell et al. | 117—93.31 X |
| 3,310,424 | 3/1967 | Wehner et al. | 117—93.31 X |

ALFRED L. LEAVITT, *Primary Examiner.*

A. GOLIAN, *Assistant Examiner.*